(12) United States Patent
Chu et al.

(10) Patent No.: US 6,285,229 B1
(45) Date of Patent: Sep. 4, 2001

(54) DIGITAL DELAY LINE WITH LOW INSERTION DELAY

(75) Inventors: Albert M. Chu; Frank D. Ferraiolo, both of Essex Junction; John A. Fifield, Underhill, all of VT (US); Teresa Thi Nguyen, Santa Clara, CA (US); Michael Sofranko, Fort Collins, CO (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/471,898

(22) Filed: Dec. 23, 1999

(51) Int. Cl.[7] ................................................. H03H 11/26
(52) U.S. Cl. ......................... 327/277; 327/278; 327/284
(58) Field of Search ........................... 327/277, 278, 327/284, 393–396

(56) References Cited

U.S. PATENT DOCUMENTS

| | | | |
|---|---|---|---|
| 4,805,195 | * 2/1989 | Keegan | 375/354 |
| 5,034,967 | 7/1991 | Cox et al. | 375/119 |
| 5,109,394 | 4/1992 | Hjerpe et al. | 375/119 |
| 5,192,886 | 3/1993 | Wetlaufer | 327/158 |
| 5,374,860 | * 12/1994 | Llewellyn | 327/276 |
| 5,420,531 | 5/1995 | Wetlaufer | 327/270 |
| 5,644,261 | 7/1997 | Frisch et al. | 327/277 |
| 5,670,904 | * 9/1997 | Moloney et al. | 327/277 |
| 5,712,883 | 1/1998 | Miller et al. | 375/371 |
| 5,994,938 | * 11/1999 | Lesmeister | 327/277 |
| 6,025,744 | * 2/2000 | Bertolet et al. | 327/276 |

* cited by examiner

*Primary Examiner*—Toan Tran
*Assistant Examiner*—Cassandra Cox
(74) *Attorney, Agent, or Firm*—McGuireWoods, LLP; Robert A. Walsh

(57) ABSTRACT

A variable digital delay line with an insertion delay as low as a single delay element yet capable of providing a large programmable delay with a small simple control mechanism. A loop connects an input to an output through selectable first delay elements such as 2:1 muxes and selectable second delay elements such as pairs of inverters by way of a plurality of intermediate nodes having a tap. A plurality of sneak paths are available wherein the loop by passes a remainder of first delay elements and/or second delay elements by way of the taps at the intermediate nodes.

12 Claims, 5 Drawing Sheets

TRUTH TABLE FOR CONTROL LOGIC

| CONTROL WORD | A | B | C | D | S2 | S1 | S0 |
|---|---|---|---|---|---|---|---|
| 1.00 | 0 | 1 | 1 | 1 | 0 | 0 | 0 |
| 2.00 | 1 | 0 | 1 | 1 | 0 | 0 | 0 |
| 3.00 | 1 | 1 | 0 | 1 | 0 | 0 | 0 |
| 4.00 | 1 | 1 | 1 | 0 | 0 | 0 | 0 |
| 5.00 | 1 | 1 | 1 | 0 | 0 | 1 | 1 |
| 6.00 | 1 | 1 | 1 | 0 | 1 | 0 | 0 |
| 7.00 | 1 | 1 | 1 | 0 | 1 | 0 | 1 |
| 8.00 | 1 | 1 | 1 | 0 | 1 | 1 | 0 |
| 9.00 | 1 | 1 | 1 | 0 | 1 | 1 | 1 |
| 10.00 | 1 | 1 | 1 | 1 | 0 | 0 | 0 |
| 11.00 | 1 | 0 | 1 | 1 | 0 | 1 | 1 |
| 2.50 | 1 | 1 | 0 | 1 | 0 | 0 | 1 |

FIG.4

DIGITAL DELAY LINE WITH LOW INSERTION DELAY

CROSS-REFERENCE TO RELATED APPLICATIONS

This application is related to U.S. patent application Ser. No. 09/263,035, filed Mar. 5, 1999 for a "DUAL MODE PROGRAMMABLE DELAY ELEMENT" by Roger Paul Gregor, assigned to the same assignee as the present invention, International Business Machines Corp. (IBM), and U.S. patent application Ser. No. 09/263,671, filed Mar. 5, 1999 for a "PROGRAMMABLE DELAY ELEMENT" by Albert M. Chu et al., a joint inventor of the present invention, and also assigned to the same assignee as the present invention, and hereby fully incorporated by reference.

DESCRIPTION

BACKGROUND OF THE INVENTION

1. Field of the Invention

The present invention generally relates to digital circuits for providing a delay of digital signals, and more particularly to programmable delay lines for correction, synchronization, and minimization of propagation times of digital signals.

2. Description of the Prior Art

Modern digital logic circuits such as digital logic circuits that are included in digital data processors are characterized by short signal propagation times which are enhanced by decreased switching element (e.g. transistor) sizes and increased integration density. The short signal propagation times are exploited by reducing clock cycle times so that logic functions and data processing can be carried out more rapidly. However, some signal paths will necessarily have longer propagation times than others, and intended functions cannot be carried out unless proper signals are simultaneously present. This synchronization becomes more critical as clock cycle times are reduced.

It is a common practice to provide programmable delay lines to delay selected ones of related signals to correspond to the arrival of another selected signal in order to synchronize the arrival of the plural signals at a particular node. The functional speed of an entire circuit may be determined by one or more paths through the circuit. Such a path is sometimes referred to as a critical path.

In general, it is also common practice to generate such delays in digital signals by propagating signals through a plurality of rapidly switched identical stages such as serial pairs of inverter circuits that are arrayed so propagation time over connections between stages, or between taps and an output, is substantially constant. While some variation in propagation time is inevitable, the propagation time through a pair of inverters is a sufficiently small time increment which is short compared to clock cycle time to approximate the required delay resolution.

Programmable delay elements are used in the design of delay locked loops (DLLs). In turn, a DLL may be used to delay a clock or clocks, or the transmission of data, in order to synchronize critical timings in a computer system. Sometimes, both a clock and data are delayed by a DLL to synchronize critical timings.

The ability to program such delay elements potentially reduces the design burden of designing particular delay elements for many nodes of a circuit that may correspond to a critical path. However, it should be appreciated that delay elements can consume significant amounts of chip space, depending on the maximum amount of delay to be accommodated or provided. While the maximum delay can be estimated, the maximum delay must be matched fairly closely with the actual delay needed in order to avoid excessive consumption of chip space and specific designs of delay lines for specific maximum delays may be required, depending on other design and/or operational constraints One method of improving the timing between the elements of a chip within a computer system is the use of a digital DLL. Digital DLLs typically employ variable programmable delay lines where the incremental delay unit is one or two logic gates. However, the mere inclusion of a DLL provides some delay time that cannot be avoided. This minimum delay for which the line can be programmed is referred to as the insertion delay of a variable delay line. Thus, the insertion delay is an important property to consider in the design of a programmable variable delay line.

Insertion delay is especially important when dealing with a high frequency operation because a long insertion delay can prevent the DLL from operating at a single clock cycle. For example, if a clock is operating on a 10 ns cycle, and the latent delay associated with the clock tree is 3 ns, then a DLL will be unable to operate at a single clock cycle if the insertion delay of the DLL is greater than 7 ns. If the insertion delay of the DLL in this example was 8 ns, then the DLL would be forced to operate at a 20 ns cycle, twice the amount of a single clock cycle.

This clock cycle jump increases the vulnerability of the computer system to operational errors caused by occasional variations in the output of an associated power supply. A low insertion delay can enable the DLL to operate at a single clock cycle, thus significantly reducing or even eliminating concern regarding "jitters" or other errors caused by variations in the power supply.

Another important factor in the design of a variable delay line is the frequency range over which the line is capable of operating. A programmable delay line with a large range of delays is capable of operating over a larger frequency range than a delay line with a small range of delays. Thus, a programmable delay line with a large range of delays is superior to a delay line with a small range of delays. However, there is a trade off between chip space and resolution and maximum delay range.

It is also desirable for consistency of resolution over a range of delays to provide an equal length of delay from each tap of the delay line to the output of the multiplexer including the connections from the inverters to the multiplexer inputs. Accommodation of this preference increases the complexity of the delay line design and requires unique layouts for delay elements of each different delay to be produced. Again, there is a trade-off between chip space and the number of delay element designs which may be required in the overall logic circuit or processor design.

Another consideration in the design of programmable DLLs is the need to latch the control signals. The control signals must be stable at logic voltage levels in order to correctly control the DLL. Variance of the control voltage can affect propagation time through transmission gates in multiplexers controlling the delay path. Noise causing the control voltages to vary, even briefly, while a signal of interest is propagating through the DLL can redirect the signal, changing the delay or even allow multiple pulses to simultaneously propagate on different paths. Latches to stabilize control voltages and program the DLL before input may require a minimum of four to six elements or two to three times the footprint of a single delay element. Therefore, the footprint area of the latches can exceed the footprint area of the array of delay elements in some designs. Unfortunately, in known designs, efficiency of control signal size in number of bits of control signal is often achieved only at the expense of increased insertion delay and vice versa.

SUMMARY OF THE INVENTION

Thus, an object of the present invention is to provide a variable delay line with a lower insertion delay, the minimum delay at which the variable delay line can be programmed.

Another object of the present invention is to enable a DLL to operate at the frequency of a single clock cycle.

Yet another object of the present invention is to provide a programmable delay line with a large range of delays and thereby increase the frequency range over which a variable delay line is capable of operating.

Still another object of the present invention is to reduce the chip area consumed by a variable delay line.

In order to accomplish these and other objects of the invention, the variable digital delay line of the present invention includes a loop that connects an input to an output through selectable first delay elements such as 2:1 muxes and selectable second delay elements such as pairs of inverters by way of a plurality of intermediate nodes having a tap. A plurality of sneak paths are available wherein the loop by passes a remainder of first delay elements and/or second delay elements by way of the taps at the intermediate nodes. In this manner, the variable digital delay line of the present invention achieves an insertion delay as low as a single delay element and is yet capable of providing a large programmable delay with a small simple control mechanism.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a truth table of exemplary control logic for the delay line.

DETAILED DESCRIPTION OF A PREFERRED EMBODIMENT OF THE INVENTION

Figure 1A:
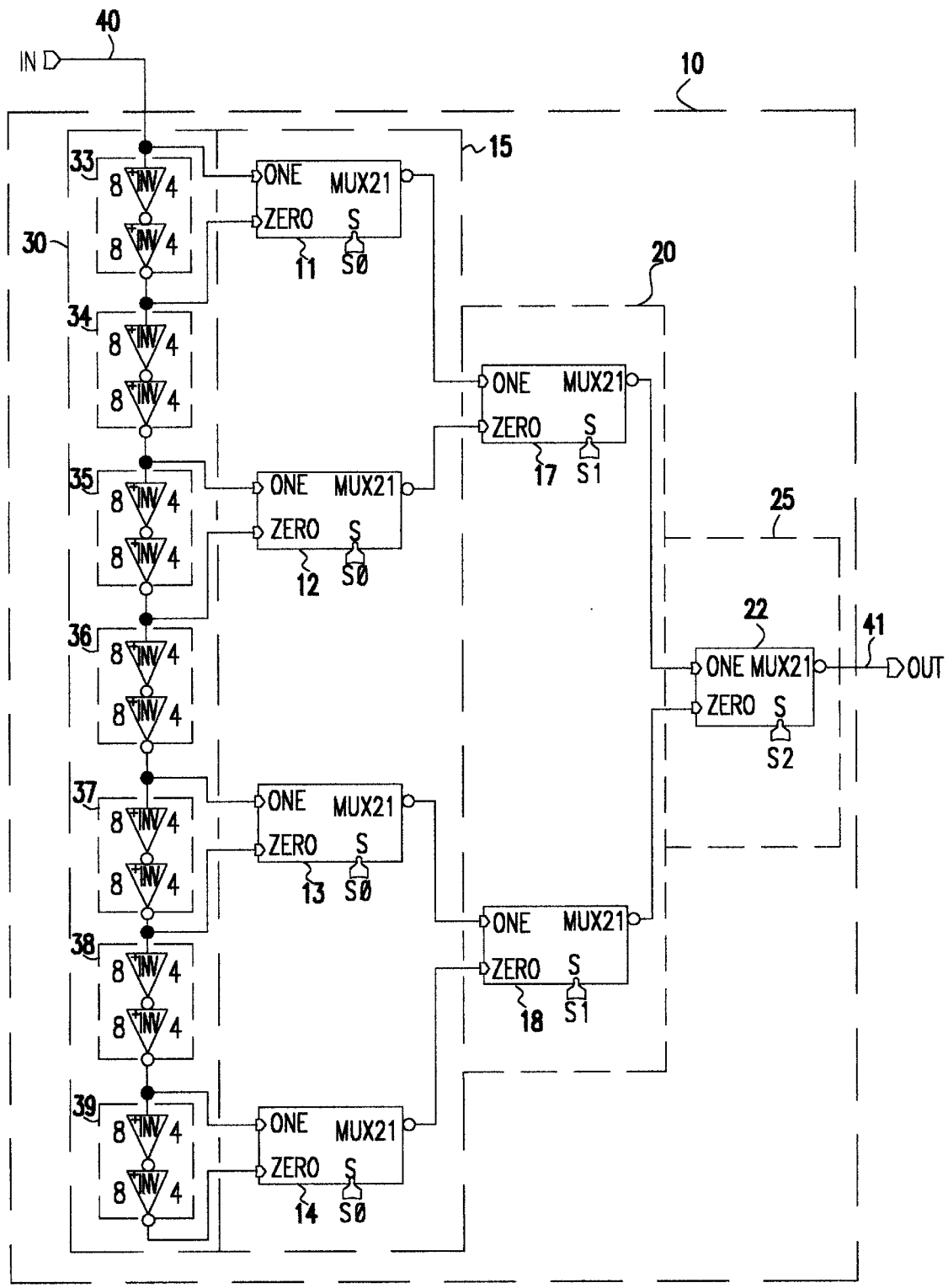
FIG. 1A is a schematic diagram of a first alternative embodiment of a delay line over which the present invention is an improvement.

Referring now to the drawings, and more particularly to FIG. 1A, there is shown a schematic diagram of a first alternative embodiment of a delay line over which the present invention is an improvement. It is not admitted that the delay line shown in FIG. 1A is prior art. FIG. 1A is provided to facilitate an understanding of the present invention. Accordingly, FIG. 1A is labeled as "Related Art".

In this embodiment, a multiplexer (mux) array 10 contains seven 2:1 muxes wherein the outputs of four muxes 11–14 in a first logic layer 15 become the inputs to two muxes 17–18 in a second logic layer 20, and the outputs of the muxes 17–18 in the second logic layer 20 become the inputs to the seventh mux 22 which alone constitutes a third logic layer 25. The propagation delay through the three layers illustrated 15, 20, and 25 is equal to three times the delay through a single 2:1 mux. More logic levels could, of course, be provided for a larger delay range (or higher delay resolution or a combination thereof) at the expense of a geometrical increase in the number of muxes and the space required to form them.

Prior to the first logic layer 15, an inverter array 30 contains seven serial pairs of inverter circuits 33–39. This inverter array 30 is designed such that propagation time over connections between pairs of inverter circuits 33–39 is substantially constant and substantially equal to the propagation time through a 2:1 mux. Each 2:1 mux is a delay element in the delay line shown as are inverter pairs 33–39. In fact, any electronic device capable of conducting an electric signal can be used to create a delay in a delay line. Even something as simple and basic as a wire will impart a certain amount of delay to the signal. The critical goal is selecting a device capable of imparting a delay that is relatively constant, measurable and repeatable. Thus, the exemplary 2:1 muxes will be referred to as a first delay element and the exemplary pairs of inverters will be referred to as a second delay element in this embodiment of the delay line. The first delay elements are connected as a switching array and the second delay elements are connected as a tapped delay line.

The logical operation of the 2:1 muxes in the mux array 10 is controlled by three control bits S0–S2. The value of these control bits determines the route a delay line input 40 follows to the delay line output 41. Thus, in FIG. 1A, the desired number of inverter pairs 33–39 through which the delay line input signal 40 will effectively pass before reaching the output 41 is determined by the value of the three control bits S0–S2, assuming that the control bits S0–S2 are unaffected by noise. It should be understood however that the input signal 40 propagates through all of the inverter pairs 33–39 regardless of the value of the control bits S0–S2.

As designed, a simple binary counter can be easily implemented to supply and latch the values of the control bits S0–S2. By assigning the most significant bit in the counter to S2, and the least significant bit in the counter to S0, then the delay associated with one pair of inverters 33–39 will be added to the delay for each step as the counter counts down from 111 to 000. Of course, control bits S0–S2 can also be controlled in some manner other than through the use of a counter. For example, the delays can be measured, set, and latched directly. For a DRAM, 200 cycles are available to lock on to the delay and resolve the skew of a signal. Some other applications may have more than 200 cycles available to lock on to the delay and resolve the skew.

When S2='1', S1='1', and S0='1' (binary "seven" defining an example of a control word "111"), then the route desired for the delay line input 40 will be through the mux array 10 by way of mux 11, mux 17, and mux 22 bypassing the pairs of inverters 3339 in the inverter array 30. The presence of noise affected the control bits S0–S2 could affect this desired route as well as any subsequently desired route described for a given combination of control bits. When the counter decrements one binary count unit to binary six or control word 110, the desired route for the delay line input 40 will be through the first pair of inverters 33 before passing through muxes 11, 17, and 22.

For each decrement of the binary counter, an additional pair of inverters 33 will be added to the desired route for the delay line input 40 through the mux array 10. At the other end of the counter cycle, when S2='0', S1='0', and S0='0' (binary "zero" or 000), then the desired route for the delay line input 40 is through the mux array 10 by way of mux 14, mux 18, and mux 22 after passing through all seven of the pairs of inverters 33–39 in the serial inverter array 30.

In another alternative embodiment (not shown), the delay available from a delay line laid out like the delay line in FIG. 1A can be incrementally increased by counting up with a binary counter instead of counting down with a binary counter. In order to obtain this control function, simply invert the inputs to the ports of the seven 2:1 muxes shown in FIG. 1A. Of course, other implementations are possible incorporating other orientations of the inputs relative to the ports of the first delay elements. In any case, the available range of delay is between three and ten units of delay, and the insertion delay is the minimum delay of three times the propagation delay of a 2:1 mux, as shown at bracket 322 in FIG. 3, for embodiments consistent with the organization shown in FIG. 1A.

The insertion delay of a variable delay line is the minimum delay through the line. Thus, the insertion delay of the first alternative embodiment of a delay line shown in FIG. 1A is defined when the control word is 111. In that case the delay line input 40 does not pass through any of the inverter pairs 33–39. So, the insertion delay of the variable delay line shown in FIG. 1A is three times the delay of the individual 2:1 mux components. This insertion delay is relatively high as will be seen.

The depth of a mux array consistent with the organization illustrated in FIG. 1A is equal to the base two logarithm of the number of first delay elements in the array rounded up to the next integer. The depth of a mux array following the organization illustrated in FIG. 1A could also be represented as the base two logarithm of the number of pairs of second delay elements plus one. Either representation will yield a mux array depth for the delay line shown in FIG. 1A of $\log_2(7)$ rounded up to the next integer which is 3. If a delay line had 127 first delay elements, the mux array depth would be $\log_2(127)$ rounded up to the next integer which is 7 or seven times the insertion delay of a single mux. This increased delay range increases the insertion delay as well as requiring substantial chip space.

The control mechanism for these delay lines can be a simple binary counter of $\log_2(N)$ rounded up to the next integer number of bits where N is the number of first delay elements or pairs of second delay elements as shown in the above examples. Thus, three bits (S2, S1, and S0) are needed to control the seven 2:1 muxes in FIG. 1A. An advantage of this embodiment is that it enables the control of a relatively large number of first delay elements with a relatively small control word consisting of relatively few control bits. However, the distance traveled between various delay elements needs to remain relatively constant. Otherwise, the cumulative delay can be affected due to significantly varying delay times through the lines that connect the delay elements. As an array of first delay elements gets quite large, it may be difficult to keep the unit of delay relatively constant due to space considerations regarding the layout of the delay elements on a chip.

Figure 1B:
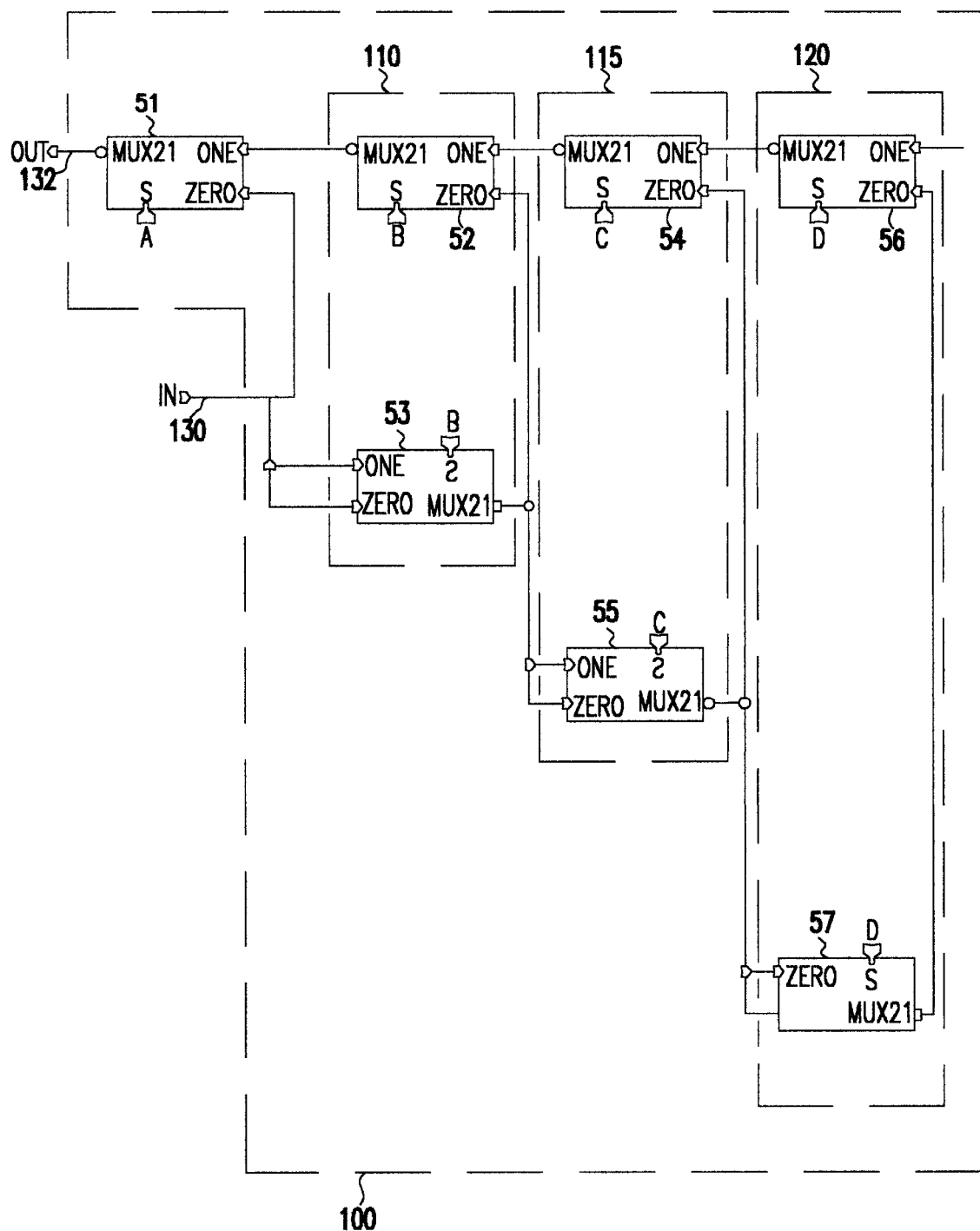
FIG. 1B is a schematic diagram of a second alternative embodiment of a delay line over which the present invention is an improvement.

Referring now to FIG. 1B, a second alternative embodiment of a delay line over which the present invention is an improvement is shown. The embodiment of a delay line shown in FIG. 1B is described in greater detail in U.S. patent application Ser. No. 09/263,065, filed Mar. 5, 1999 for a "DUAL MODE PROGRAMMABLE DELAY ELEMENT" by Roger Paul Gregor, assigned to the same assignee as the present invention, International Business Machines Corp. (IBM), and U.S. patent application Ser. No. 09/263,671, filed Mar. 5, 1999 for a "PROGRAMMABLE DELAY ELEMENT" by Albert M. Chu et al., a joint inventor of the present invention, and also assigned to the same assignee as the present invention. These U.S. patent applications are therefore fully incorporated herein by reference. It is not admitted that the delay line shown in FIG. 1B is prior art. FIG. 1B is provided to facilitate an understanding of the present invention. Accordingly, FIG. 1B is labeled as related art.

In the embodiment of a delay line shown in FIG. 1B, a four bit control word ABCD controls seven 2:1 muxes 51–57. The mux array 100 of this embodiment contains a first pair 110, a second pair 115, and a third pair 120 of 2:1 muxes. The first pair of muxes 110 consists of muxes 52 and 53. The second pair 115 consists of muxes 54 and 55. And the third pair 120 consists of muxes 56 and 57. Of course, more pairs of delay elements could be provided. Mux 51 is the only 2:1 mux not contained in a pair of delay elements.

The inputs are bussed together for one mux in each pair of muxes in embodiments according to the organization shown in FIG. 1B. When mux inputs are bussed together, the affected mux is non-functional and therefore useful only for adding delay to the delay line. This operation trades a decrease in delay resolution for an increase in delay range. The inputs of muxes 53, 55, and 57 are bussed together in the illustrated embodiment.

Again, a delay line input 130 travels through the mux array 100 and becomes a delay line output 132 upon exiting the mux array 100 after a period of time representing the delay time of the delay line. In this embodiment, the shortest route the delay line input 130 can take to become the delay line output 132 is through mux 51 only. Thus, the insertion delay of this system is simply the propagation delay of one 2:1 mux component, one-third the insertion delay of the embodiment illustrated in FIG. 1A.

If the size of the mux array 100 in FIG. 1B is increased by adding pairs of delay elements, the shortest route for the delay line input 130 to take to become the delay line output 132 will still remain through mux 51 only. Thus, as the size of the mux array 100 is increased, its insertion delay will remain constant at a value equal to the propagation delay through one delay element. Therefore, the insertion delay of an embodiment of a delay line consistent with the organization shown in FIG. 1B will always be smaller than the insertion delay of a delay line according to the organization shown in FIG. 1A. In fact, the larger the number of first delay elements implemented in the embodiment of FIG. 1A, the larger the difference between the insertion delays of the two embodiments will be.

The insertion delay advantage of the embodiment shown in FIG. 1B versus the embodiment shown in FIG. 1A comes however at the cost of the decoder necessary to operate the line shown in FIG. 1B and at the cost of the delay resolution. Again taking N to represent the number of first delay elements in the delay line, then the number of control bits necessary to operate the delay line shown in FIG. 1B is (N+1)/2. A 1 of N code is required to select a single path that is inherently inefficient in terms of bits, all of which must be latched. Thus, if the number of first delay elements is 127, then the number of control bits necessary to operate the delay line is (127+1)/2 or 64 bits. As previously described, the embodiment shown in FIG. 1A requires only 7 control bits to operate a delay line comprised of the same number of first delay elements.

Not only does the embodiment in FIG. 1B require more control bits to operate the delay line, it also requires a more complex control function. A simple binary counter can incrementally control the delay obtained from the delay line in FIG. 1A, but a binary counter cannot be used to incrementally control operation of the delay line shown in FIG. 1B due to the input coding required. Instead, the amount of delay realized by the delay line in FIG. 1B can be increased in odd steps from one delay element to three delay elements, to five and so on, for example, by initializing the control word corresponding to ABCD at 0111 and then performing a shift right function on the bits of the control word. Thus, the delay line in FIG. 1B has a lower resolution than the delay line in FIG. 1A.

For example, if the control word is 1101, then the delay line input 132 will pass through mux 53, then mux 55, mux 54, mux 52, and finally mux 51, before exiting the mux array 100 as the delay line output 132. The delay realized by this example is equal to five times the propagation delay of a single first delay element, the 2:1 mux here.

In summary, the embodiment shown in FIG. 1A has a small control code and a simple decoder but a large insertion delay in comparison to the embodiment of a delay line shown in FIG. 1B, while the embodiment illustrated in FIG. 1B has a short insertion delay but a large control code and more complex decoder in comparison to the embodiment of a delay line shown in FIG. 1A. Other arrays may have different combinations of advantages and disadvantages, but none provide the combination of low insertion delay, loop configuration, equal propagation delay to output, and small, simple control logic for short control codes.

Figure 2:
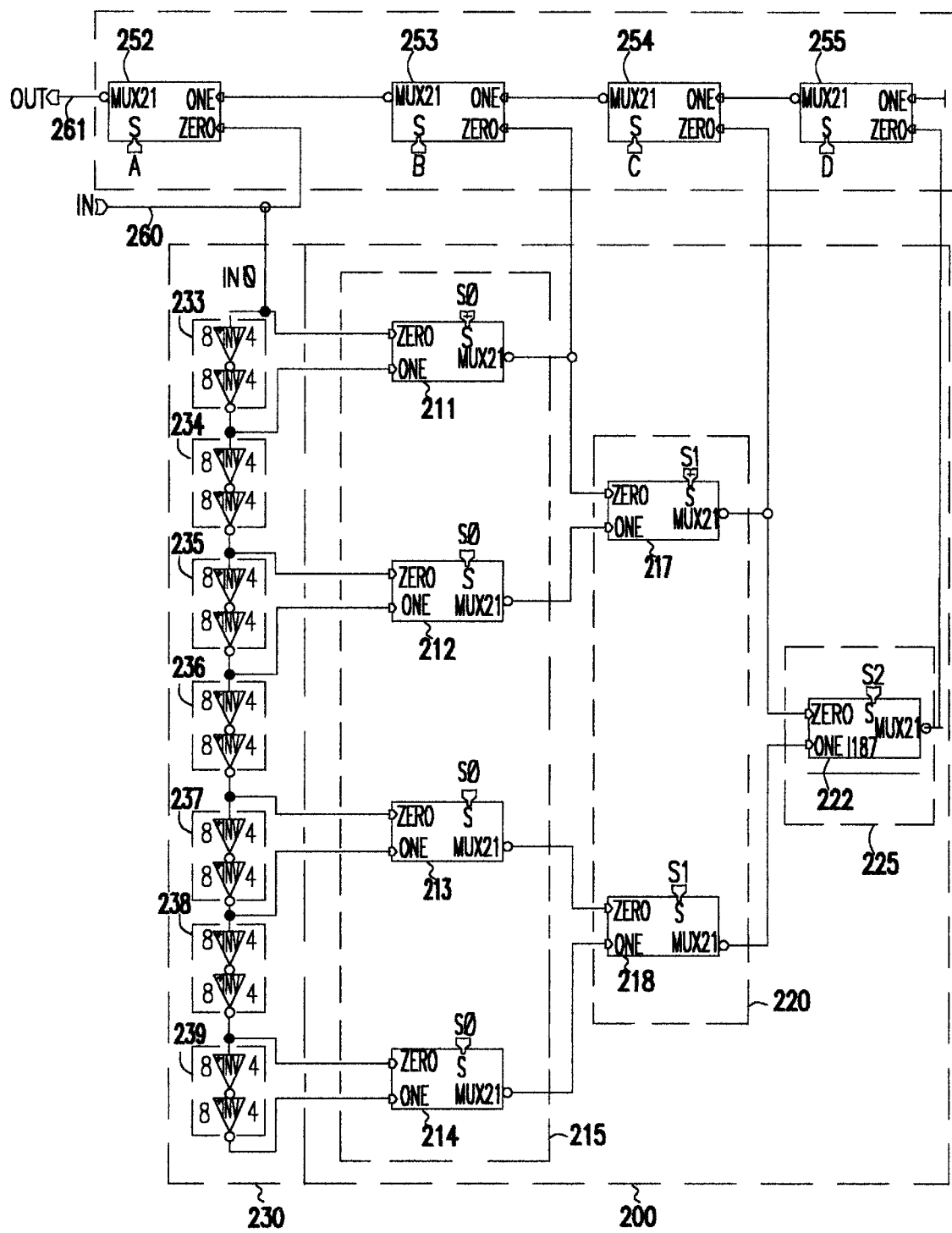
FIG. 2 is a schematic diagram of an exemplary embodiment of a delay line in accordance with the present invention.

Referring now to FIG. 2, a schematic diagram of an exemplary embodiment of a delay line in accordance with the present invention is shown. This embodiment combines the advantages of the embodiment shown in FIG. 1A with the advantages of the embodiment shown in FIG. 1B. In other words, as will now be described, this exemplary embodiment has a low insertion delay, a loop configuration, equal propagation delays to the output, and small, simple control logic for control codes of relatively short bit length.

A first mux array 200 in FIG. 2 mirrors the structure of the mux array 10 in FIG. 1A. Thus, the first mux array 200 contains seven 2:1 muxes wherein the outputs of four muxes 211–214 in a first logic layer 215 become the inputs to two muxes 217–218 in a second logic layer 220, and the outputs of the muxes 217–218 in the second logic layer 220 become the inputs to the seventh mux 222 of this first mux array 200, the seventh mux 222 alone constituting a third logic layer 225 of the first mux array 200.

Prior to the first logic layer 215 of the first mux array 200, an inverter array 230 contains seven serial pairs of inverter circuits 233–239. As with the inverter array 30 in FIG. 1A, this array 230 is also designed such that propagation time over connections between pairs of inverter circuits 233–239 is substantially constant. And again, the inverters are the second delay elements in this preferred embodiment of the delay line.

A second mux array 250 consists of one first delay element for each logic layer in the first mux array 200 plus one first delay element for the inverter array 230 of second delay elements 233–239. Thus, in the example of the preferred embodiment pictured, 2:1 mux 252 corresponds to the inverter array 230, 2:1 mux 253 corresponds to the first logic layer 215, 2:1 mux 254 corresponds to the second logic layer 220, and 2:1 mux 255 corresponds to the third logic layer 225. This second mux array 250 has a loop design in this fashion.

The logical operation of the 2:1 muxes in the first mux array 200 is controlled by three control bits S0–S2. The logical operation of the 2:1 muxes in the second mux array 250 is controlled by four control bits A–D. The value of these control bits determines the route a delay line input 260 follows before becoming a delay line output 261.

Initially, the control words ABCD and (S2,S1,S0) are initialized to 0111 and 000 respectively. This arrangement routes the delay line input 260 directly to mux 252. This results in a delay of one 2:1 mux delay element. This is the smallest delay available from this circuit and thus the insertion delay of the delay line.

There are two modes of incrementing the delay available from the delay line shown in FIG. 2. In the first mode, the delay is increased by performing a shift right function on the ABCD control word as was described in greater detail in connection with the delay line shown in FIG. 1B while holding the values of the S2, S1, and S0 control bits constant. In the second mode of incrementing the delay available from the delay line shown in FIG. 2, the delay is increased by incrementing S2, S1, S0 with a binary counter. This second mode of incrementing delay was previously discussed in greater detail in connection with the delay line shown in FIG. 1A. Through this operation, the number of bits for the control word of muxes 252–255 is equal to the number of logic layers in the first mux array 200 plus one.

In an exemplary application, the binary counter incrementation of S2, S1, S0 is held in abeyance until the control word ABCD has been right shifted to 1110. Of course, as will be explained in greater detail below, the delay line shown can be operated for many other combinations of control bits.

The second mux array 250 provides a mechanism by which the three layer propagation delay that was unavoidable in the first alternative embodiment of FIG. 1A can be by-passed in this preferred embodiment as will be explained below. The second mux array 250 incorporates the low insertion delay of the alternative embodiment shown in FIG. 1B by providing several possible "sneak paths". The insertion delay of this preferred embodiment of the inventive delay line by-passes some or all of the logic layers in the first mux array 200.

The shortest sneak path, corresponding to the insertion delay of the delay line shown, is obtained under the initial conditions when control word ABCD is 0111. In that case, the delay line input 260 is routed directly through mux 252. This is true regardless of the value of control bits S2,S1,S0.

A second sneak path is available through mux 253 when control word ABCD is 1011. In that case, if control bit S0 is a '0', then a delay of three muxes is obtained by routing delay line input 260 through mux 211, mux 253, and mux 252. The sneak path is obtained when the signal is routed out of the first mux array 200 and into the second mux array 250 without passing through mux 225. If control bit S0 is '1', then a delay of four units is obtained by routing the signal through inverter pair 233 prior to entering mux 211 and then following the path described above. These second sneak paths are available without regard to the value of control bits S2 and S1.

In a similar manner, a third sneak path is available through mux 254 when control word ABCD is 1101. When using this third sneak path, a minimum delay of five delay units is available when S1 and S0 are '0', thus routing the delay line input 260 through mux 211, mux 217, and then sneaking out of the first mux array 200 through mux 254, mux 253, and mux 252. A maximum delay of eight delay units is obtained when S1 and S0 are '1' thus routing the delay line input 260 through inverter pair 233, inverter pair 234, inverter pair 235, mux 212, mux 217, and then exiting the first mux array 200 again through muxes 254, 253, and 252. A delay of six delay units is obtained via the third sneak path when S1='0' and S0='1', and a delay of seven delay units is obtained via the third sneak path when S1='1' and S0='0'. These third sneak paths are available without regard to the value of control bit S2.

Thus, delays of one unit, and three to eight units can be obtained through sneak paths in the embodiment shown in FIG. 2. When control word ABCD is 1110, the sneak paths are closed. In that case, delays of seven delay units through fourteen delay units are obtained by incrementing control bits S2,S1,S0 according to a binary count. Of course, delays greater than fourteen delay units can be obtained by adding logic layers to the first mux array 200 and corresponding mux delay elements in the inverter array 230, and in the second mux array 250 for each logic layer added to the first mux array 200.

To illustrate the advantages of this exemplary embodiment. Take again the previously discussed example of the first mux array containing 127 first delay elements. In the preferred embodiment, the 127 first delay elements would be arrayed in a first mux array in an organization having seven logic layers as previously described in connection with the alternative embodiment shown in FIG. 1A. Then, eight additional delay elements would be added in a second mux array following the organization shown, one for the inverter array of second delay elements, and one associated with and connected in a loop to each of the logic layers in the first mux array.

The first logic layer in this layout would have 64 first delay elements. Therefore, the connected inverter array would have 254 second delay elements. Thus, this embodiment of the preferred delay line would contain a total of 135 first delay elements and 254 second delay elements. Yet, this layout would have an insertion delay of only one 2:1 mux delay element and control of this delay line would require only fifteen control bits.

A delay line with according to the organization shown in FIG. 1A with 127 first delay elements and 254 second delay elements would have an insertion delay seven times as large as the insertion delay of the example of the preferred embodiment with 135 first delay elements and 254 second delay elements. A delay line according to the organization shown in FIG. 1B with 135 first delay elements would require 68 control bits, more than four times the number of control bits required to operate the example of the preferred embodiment with 135 first delay elements and 254 second delay elements. This exemplifies the advantages of the organization for a delay line depicted in FIG. 2. The delay line architectural organization shown can be expanded to achieve a large delay value while maintaining a low insertion delay and minimal control logics. The high insertion delay associated with the delay line illustrated in FIG. 1A is eliminated at the cost of only adding an extra 2:1 mux delay element and an extra control bit for each logic layer in the first mux array. Thus, the invention provides more total delay than that of FIG. 1A for the same number of delay elements contained within the delay line.

Figure 3:
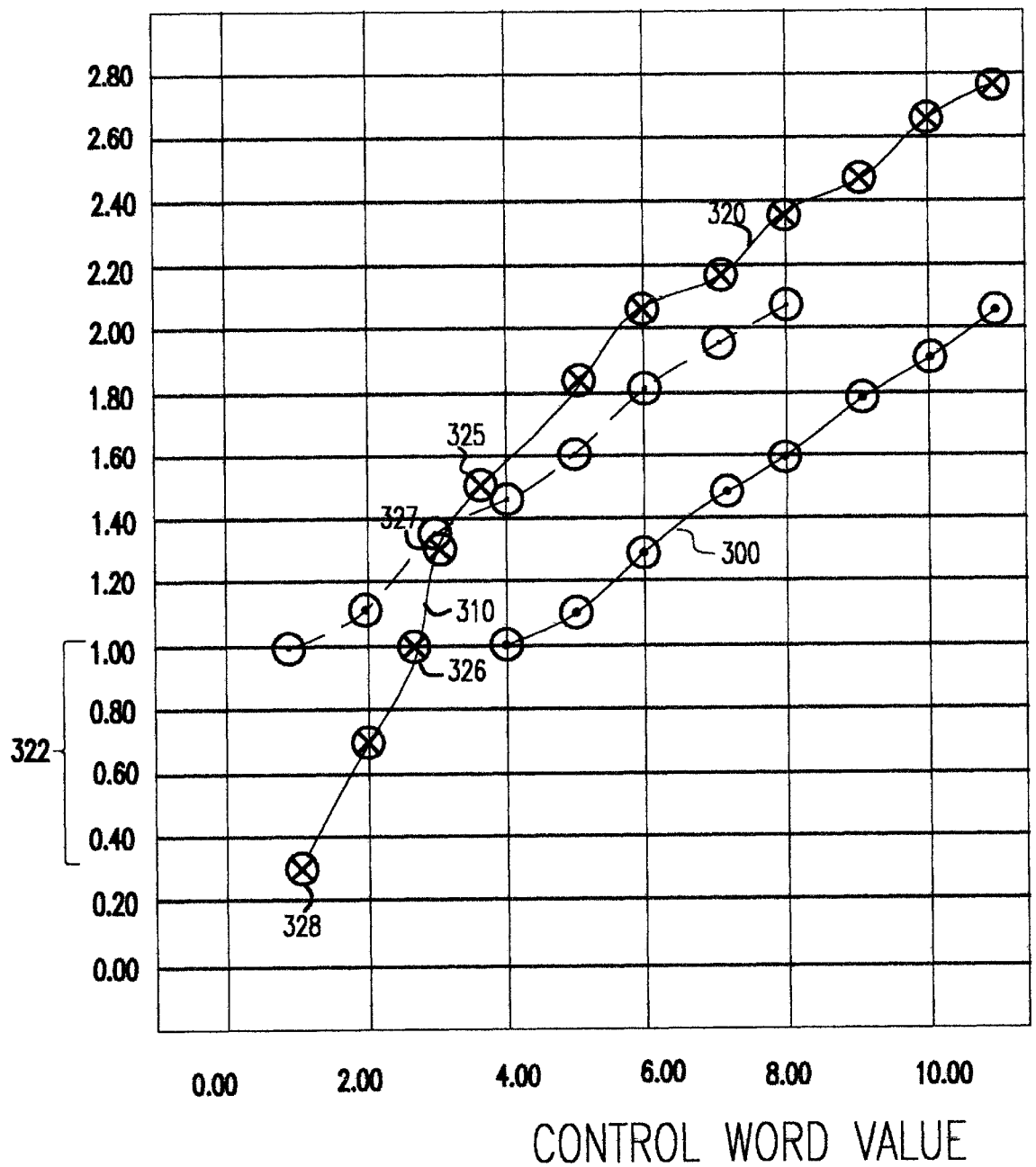
FIG. 3 is a graphical X-Y plot diagram showing the delay intervals available from the alternative delay lines illustrated in FIGS. 1A and 1B, and the preferred embodiment of the present inventive delay line illustrated in FIG. 2, with respect to the input selections from the control circuit of the present invention.

Referring now to FIG. 3, a graphical X-Y plot diagram shows several curves. The X-axis represents the value of the control word. As the value of the control word goes up, more delay is added to the associated programmable delay line. Thus, the curves shown in FIG. 3 have a positive slope with respect to the Y-axis which represents the length of the delay available in units of nanoseconds.

In these units, curve 300 shows the delay intervals available from the delay line of FIG. 1A. Curve 300 consists of data points denoted by data point symbol 305. Curve 310 shows the delay intervals available from the delay line of FIG. 1B and consists of four data points denoted by data point symbol 315. Curve 310 is superimposed on curve 320 which shows the delay intervals available from the exemplary embodiment of the present inventive delay line illustrated in FIG. 2. Curve 320 consists of data points denoted by data point symbol 321.

FIG. 4 is a truth table specifying the actual input selections from the control logic circuit of the various embodiments of the present invention used with regard to the various values of the control word represented in the X-axis of FIG. 3. It should be noted however that control bits A to D do not apply to the delay line shown in FIG. 1A. Only control bits S2 to S0 apply to the delay line shown in FIG. 1A. Note further that, with respect to control bits S2 to S0, control words 1 to 3 are the same as control word 4. For this reason, curve 300 is not plotted in FIG. 3 for control words 1 to 3.

Likewise, it should be noted that control bits S2 to S0 do not apply to the delay line shown in FIG. 1B. Only control bits A to D apply to the delay line shown in FIG. 1B. Note further that, with respect to control bits A to D, control words 5 to 11 are the same as control word 4. For this reason, curve 310 is not plotted in FIG. 3 for control words 5 to 11.

Note still further that the control words denoted in FIG. 4 by control word values 2.50 and 3.50 are a part of curve 320, but not a part of curve 310. These control words correspond to two of the sneak paths previously discussed, available from the exemplary embodiment of the present inventive delay line as shown in FIG. 2 and represented by curve 320, but unavailable from the embodiment of a delay line shown in FIG. 1B and represented by curve 310. Thus, data point 326 and data point 327 in FIG. 3 are a part of curve 320, but not a part of curve 310 which is superimposed on curve 320 from data point 328 to data point 325.

As previously discussed, the insertion delay of a delay line is the lowest delay available from the line. Thus, in order to compare the insertion delay of curve 300 to the insertion delay of curve 310 and curve 320, one must imagine curve 300 shifted three control words to the left such that the leftmost point on each curve was aligned with the same point on the X-axis. This shift left is represented by phantom curve 324. The resulting difference of insertion delays is represented by bracket 322.

As also previously discussed, the delay line of FIG. 1A is characterized by a high insertion delay. Thus, curve 300 is noticeably higher on the Y-axis at its leftmost point than curve 310 and curve 320 at their leftmost points. Thus, phantom curve 324 is noticeably higher than curve 310 and curve 320 for control word values of 1.00 and 2.00. In other words, the delay line represented by curve 300 has a higher minimum delay than the delay line represented by curve 310 or by curve 320.

The delay line of FIG. 1B, represented by curve 310, achieves an insertion delay much lower than the insertion delay represented by curve 300. However, the delay line of curve 310 achieves this benefit at the cost of complex control logic. The preferred delay line, as represented by plot 320, transitions to a "sneak path" at plot point 325. In other words, the preferred delay line only uses the sneak path when the control word value is four or smaller.

To the left of plot point 325, that is when the control word value is four or lower than four, the delay line represented by plot curve 320 uses its sneak path.

Similarly, to the right of plot point 325, or when the control word value is above four, the preferred delay line represented by curve 320 is not using its sneak path. Thus, to the right of plot point 325, the preferred delay line represented by curve 320 is higher than the delay line represented by curve 300 even if curve 300 is left shifted as represented by phantom curve 324. In other words, the delay line represented by curve 320 achieves a larger delay than the delay line represented by curve 300 for control word values greater than or equal to four.

To the left of plot point 325 the slope of curve 320 is greater than the slope of curve 320 to the right of plot point 325. This defines a dual slope plot curve. For some applications, a constant slope is preferable to the dual slope of curve 320. In such cases, delay resolution can be adjusted using various known techniques to obtain the required constant delay resolution. One such technique is a "fine adjust" technique described in to U.S. patent application Ser. No. 09/263,065 and U.S. patent application Ser. No. 09/263,671, filed Mar. 5, 1999 for a "PROGRAMMABLE DELAY ELEMENT" by Albert M. Chu et al., previously cited and incorporated herein by reference.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A variable digital delay line having an insertion delay of a single delay element and enabling a large programmable delay with a small simple control mechanism, said variable digital delay line comprising:
   an input;
   a loop connecting said input to an output through selectable first delay elements and selectable second delay elements, by way of a plurality of intermediate nodes having a tap; and
   a plurality of sneak paths wherein said loop connects selected ones of said taps at said intermediate nodes to said output.

2. A variable digital delay line as claimed in claim 1, wherein said loop comprises a first side and a second side, said variable digital delay line further comprising:
   a plurality of said second delay elements arranged in a series, said plurality of said second delay elements being connected to said input, said intermediate nodes being evenly interspersed among said plurality of said second delay elements, said series within said first side of said loop;
   a first array of said first delay elements within said first side of said loop, a portion of said first delay elements in said first array being connected to said taps; and
   a second array of said first delay elements within said second side of said loop, a first one of said first delay elements in said second array being connected to said input providing a first sneak path of said plurality of sneak paths, said first sneak path bypassing said plurality of second delay elements and a remainder of said first delay elements.

3. A variable digital delay line as claimed in claim 1, wherein said first delay elements are 2:1 muxes.

4. A variable digital delay line as claimed in claim 1, wherein said second delay elements are pairs of inverters.

5. A variable digital delay line as claimed in claim 1, wherein said first delay elements and said second delay elements provide identical delays.

6. A variable digital delay line as recited in claim 1, wherein said first delay elements are connected to said taps to select said input or outputs of said second delay elements and said sneak paths bypass selected ones of said first delay elements.

7. A variable delay line comprising
   a plurality of first delay elements connected to select a tap connecting respective ones of a plurality of second delay elements, and
   a plurality of sneak paths for selectively bypassing selected ones of said first delay elements and said second delay elements.

8. A variable delay line as recited in claim 7, wherein said first delay elements are multiplexers.

9. A variable delay line as recited in claim 7, wherein said second delay elements are inverter pairs.

10. A variable delay line as recited in claim 7, wherein said first delay elements and said second delay elements provide equal delay.

11. A variable delay line as recited in claim 7, wherein said sneak paths include means for selecting intermediate nodes between said first delay elements.

12. A variable delay line as recited in claim 11, wherein said means for selecting comprises multiplexers.

* * * * *